United States Patent

Metso et al.

[11] Patent Number: 6,131,609
[45] Date of Patent: Oct. 17, 2000

[54] METHOD FOR SURVEYING THE CONDITION OF A CONTROL VALVE, AND A VALVE APPARATUS

[75] Inventors: Mika Metso; Jouni Pyötsiä, both of Helsinki, Finland

[73] Assignee: Neles Controls Oy, Helsinki, Finland

[21] Appl. No.: 09/202,201

[22] PCT Filed: Jun. 9, 1997

[86] PCT No.: PCT/FI97/00359

§ 371 Date: Dec. 4, 1999

§ 102(e) Date: Dec. 4, 1999

[87] PCT Pub. No.: WO97/48026

PCT Pub. Date: Dec. 18, 1997

[30] Foreign Application Priority Data

Jun. 11, 1996 [FI] Finland ................................ 962406

[51] Int. Cl.⁷ ............................ F16K 37/00; G01M 19/00
[52] U.S. Cl. ............................ 137/552; 137/554; 73/168
[58] Field of Search ................................ 137/551, 552, 137/554; 73/168

[56] References Cited

U.S. PATENT DOCUMENTS

| | | | |
|---|---|---|---|
| 4,029,122 | 6/1977 | Jaegtnes | 137/551 |
| 4,274,438 | 6/1981 | Coste | 137/551 |
| 4,523,286 | 6/1985 | Koga et al. | |
| 4,694,390 | 9/1987 | Lee | |
| 4,747,578 | 5/1988 | Kivipelto | |
| 4,926,903 | 5/1990 | Kawai | 137/554 |
| 5,197,328 | 3/1993 | Fitzgerald | |
| 5,253,185 | 10/1993 | Mutachler et al. | |
| 5,329,465 | 7/1994 | Arcella et al. | 137/554 X |
| 5,329,956 | 7/1994 | Marriott et al. | 137/552 X |
| 5,425,270 | 6/1995 | McDonald et al. | 137/552 X |
| 5,469,737 | 11/1995 | Smith et al. | 137/552 X |
| 5,492,009 | 2/1996 | Kempf et al. | 137/551 X |
| 5,538,036 | 7/1996 | Bergamini et al. | 137/552 |
| 5,549,137 | 8/1996 | Lenz et al. | |
| 5,992,229 | 11/1999 | Pyotsia et al. | 73/168 |

FOREIGN PATENT DOCUMENTS

| | | |
|---|---|---|
| 0708389 | 4/1995 | European Pat. Off. |
| 4326343 | 2/1995 | Germany |
| 2194648 | 3/1988 | United Kingdom |
| 95/06276 | 3/1995 | WIPO |

OTHER PUBLICATIONS

Raymond P. et al, Optimising valve actuator parameters to enhance control valve performance, ISA Transactions, vol. 35, 1996.

*Primary Examiner*—John Rivell
*Attorney, Agent, or Firm*—Pillsbury Madison & Sutro LLP

[57] ABSTRACT

A method and a valve apparatus for surveying the condition of a control valve. The position of the valve (101) is adjusted by means of an actuator (103) controlled by an electropneumatic positioner (104) and operated by means of pressure medium. The operation of the valve is monitored by sensors (109, 110, 107) that read the readings from the control signal, the input pressure of the positioner, the difference between the input and output pressure of the actuator, and the position of the valve. A fault causing a deviating reading will be located by using the readings given by the sensors and deduction rules stored in the microprocessor of the actuator. In an initial situation, when the valve is in balance state, the readings given by the sensors are stored at least from the control signal, valve position and the difference between the input and output pressure of the actuator. When the operation is continued, the readings given by the sensors are compared with the readings of the initial situation. If the deviations exceed certain limit values and remain there continuously for a certain period of time, a fault message will be given that indicates the location of the fault.

4 Claims, 6 Drawing Sheets

METHOD FOR SURVEYING THE CONDITION OF A CONTROL VALVE, AND A VALVE APPARATUS

This application is the national phase of international application PCT/FI97/00359 filed Jun. 9, 1997 which designated the U.S.

TECHNICAL FIELD

The present invention concerns a method for surveying the condition of a control valve apparatus, the position of which is adjusted by means of an actuator controlled by an electropneumatic positioner and operated by means of pressure medium, whereby the operation of the valve is monitored by sensors that during the valve operation read at certain reading intervals the readings at least from the control signal of the valve, the input pressure of the positioner, the difference between the input and output pressure of the actuator, and the position of the valve, and the fault causing the deviating reading is located by means of a microprocessor by using the readings given by the sensors and deduction rules stored in the microprocessor.

The invention also concerns a control valve apparatus comprising a valve, an actuator driven by means of a cylinder-piston device, and an electropneumatic positioner, sensors for monitoring at least the control signal of the valve, the input pressure of the positioner, the difference between the input and output pressure of the actuator, and the valve position as well as means for storing the information received from the sensors and the deduction rules to be used for locating a fault and for processing the information received from the sensors in accordance with these rules.

BACKGROUND ART

A control valve and its operation are known in the art and there is no need to describe it in more detail in this connection. The valve can be a quarter-rotational or a linear valve, said designations describing the moving direction of the closing element of the valve in the controlling situation. A quarter-rotational valve can be e.g. a ball valve or a butterfly valve. Examples of a ball valve have been described e.g. in U.S. Pat. No. 4,747,578. The valve is operated by means of an actuator that turns the turning shaft of the closing element between the closed and the opened position. The actuator can be driven by means of a cylinder piston device controlled by a pilot valve. This pilot valve is located in the positioner of the control valve. The positioner is a device for amplifying the control signal into the operation pressure of the pneumatic actuator. In the electropneumatic positioner, the electric signal is amplified into the pneumatic operation pressure. The positioner, by means of a feed-back element, also positions the valve to correspond to the control signal.

The diagnostics of control valves equipped with a pneumatic actuator is in general based on tests performed on the control valves, such as step-function response and hysteresis tests. A requirement for performing the tests is that the process is stopped, whereby the tests are performed at site of the valves. The testing equipment often also includes complicated sensors that can make the testing on the field complicated (U.S. Pat. No. 5,197,328). This is so called off-line diagnostics.

The diagnostics can also be performed on-line, whereby the positioner of the control valve monitors e.g. the position message of the valve and gives an alert if the position message deviates too much from the value presupposed by the control system. Part of the on-line diagnostics are also the operation counters of the valve that give an alert when the number of the operations exceeds a certain predetermined limit. This diagnostics system, however, does not include any deduction procedure by which the faults could be located. In both of the U.S. Pat. No. 5,329,465 and U.S. Pat. No. 4,694,390, valves have been described, in the control system of which separate measuring sensors are used. The inventions described in the publications concern an on-off regulation of the valve, not continuous controlling.

In the system according to U.S. Pat. No. 5,329,465, sensors are used for condition surveying of the valve and for collecting historical data for the data base. The fault analysis is made by comparing the measured values with the values collected earlier for the data base. The position of the valve is not adjusted continuously but the valve is moving only when it is closed or opened. This can happen a couple of times per day or the adjustment interval can even be several months. The values required for the fault analysis are monitored only during this opening and closing movement that happens at long intervals.

DISCLOSURE OF INVENTION

A method in accordance with the present invention is characterized in that for locating a fault, the same readings given by the sensors are used, by means of which the valve is controlled;

in an initial situation when the control valve is in a balance state, i.e. the changes of its position, control signal and the difference between the input and output pressure of the actuator are continuously smaller than certain values at least for a certain period of time, the readings given by the sensors at least from the control signal, the valve position and the difference between the input and output pressure of the actuator are stored;

when the operation is continued, the readings given by the sensors are compared with the values of the initial situation, and if the deviations exceed certain limit values and remain continuously above these limit values for a certain period of time, a fault message is given that informs the location of the fault.

An apparatus in accordance with the present invention is characterized in that the deduction rules have been programmed in the microprocessor of a digital positioner, said microprocessor processing the readings of the sensors.

The invention is directed to an electrically controlled pneumatic system, where the sensors used for controlling operation are also used for fault analysis. Thus, the values are collected from the valve by means of the sensors continuously. The positioning unit includes an integral self-diagnostic part that in a bus-constructed control makes it possible to transmit the information immediately to the control unit or the monitoring room.

The invention is based on a logic programmed in the digital positioner, based on which the processor of the positioner performs an on-line condition monitoring of the control valve. The quantities to be monitored by the positioner are the control current signal, the difference between the input and output pressure of the actuator, the valve position and the input pressure of the positioner. By continuously monitoring these quantities and by comparing their changes with the rules determined by the logic, the diagnostics tend to locate the faulted object in the control valve. When locating the faulted object by means of the logic, it is the purpose to find out if there is a fault in the positioner (slide), in the pneumatic actuator or in the valve. Additionally, the circuit card of the digital positioner has its own integral diagnostics, by means of which the positioner informs about the faults on the circuit cards. This diagnostics of the circuit card is, however, not a part of the present invention.

The logical rules are formed of rules, that all must be fulfilled in order to activate the diagnostics to give a fault message. As a result, the diagnostics inform the eventual faulted object.

The invention concerns the logic of the diagnostics to be programmed into the digital positioner of a control valve. The logic is formed of a deduction mechanism formed by Boolean rules.

The positioner monitors during the process inter alia the position information of the control valve, the difference between the input and output pressure of the actuator, the control signal and the level of the input pressure of the positioner. These values and their changes are compared with the deduction rules formed by Boolean rules, based on which the condition of the control valve is noted and, if necessary, alerts are given, by which the eventually faulted components are located (positioner, actuator, valve).

The deduction rules are divided into five parts giving different alerts, in other words, giving the fault message.

Alert 1 is given when a fault has been found on the circuit card of the positioner (current message, angle sensor, pre-regulating valves, pressure sensors, EEPROM and ROM memories). The diagnostics are taken care of by separate diagnostics made on the circuit card, the specific contents of which are not an object of the present invention.

Alert 2 is given when the control signal of the valve changes, but the difference between the input and output pressure of the actuator, and the position of the valve are not changed. In that case the fault message tells that there is a fault in the operation of the slide of the positioner.

Alert 3 is given when the difference quantity between the valve position corresponding to the control signal and the measured valve position exceeds the set limit continuously for a certain time. The fault message tells in that case the most probable objects of the fault. In case it is a friction problem, also alert 4 and/or alert 5 can be given.

Alert 4 is given when the control signal changes and the difference between the input and output pressure of the actuator increases, but the position of the valve is not changed. In that case, it is a question of a friction problem.

Alert 5 is given when the trend of the load factor exceeds a set limit. In that case, it is a question of a friction problem.

When the rules of the fault diagnostics and the deduction mechanism are in the memory of the positioner, information on the eventual indefinite operation of the control valve is received continuously during the process. So, the deduction is not based on tests performed separately, whereby the process would have to be interrupted, but the monitoring of the valve condition is performed and the alerts are given with an on-line system during the process. This is a significant innovation in the condition surveying of pneumatically operated control valves.

Information on the alerts can be transmitted automatically e.g. through an HART data transfer channel e.g. to a monitoring room. Thus, it is not necessary to pick up the information separately from each valve, the accessibility of which can sometimes be difficult. As it is not necessary to go to the valve in order to get the diagnostics information, also no separate equipment is required for reading the information from the valve on the field. Also no time will be spent for picking up the information.

It is not necessary to demount the valve from the piping for evaluating its condition, which is a difficult task and takes a lot of time. If alerts are given by the diagnostics, it is possible after this to perform test drives on the valve, if necessary, whereby the eventual objects of the fault can be located even more accurately. In order to perform these test drives the process has to be stopped.

Receiving continuous on-line information on the condition of control valves is significant from the point of view of preventive maintenance. A valve can operate even a long time indefinitely disturbing the operation of the process before it is serviced. In the worst case the valve can crack up causing expensive production shutdowns. These cases can be avoided, if information on the condition of the valve can be received continuously during the process.

Traditionally, the maintenance of valves has been maintenance operation to be performed during the outages of the factory, whereby the valves at the most critical points are serviced without knowing their condition in advance. In that case valves can be serviced that would not have needed any service yet, or service of valves that would have needed to be serviced can be neglected, because there is not enough time to service all the valves during the outage. If on-line information is received on the condition of the valves, the valves that need service can be located, and by means of tests a closer diagnostic can be made in order to determine more precisely their factual need of service.

The final advantage to be gained through the on-line diagnostics is the increasing safety of the process and decreasing of the costs while the feasibility of the process will be increased and the production losses decreased. Energy is saved, wastages are decreased and unpredictable production outages are avoided. Also the size of the spare part stocks can be decreased.

BRIEF DESCRIPTION OF DRAWINGS

The invention and its details are described in more detail in the following, with reference to the enclosed drawings, wherein.

MODES FOR CARRYING OUT THE INVENTION

Figure 1:
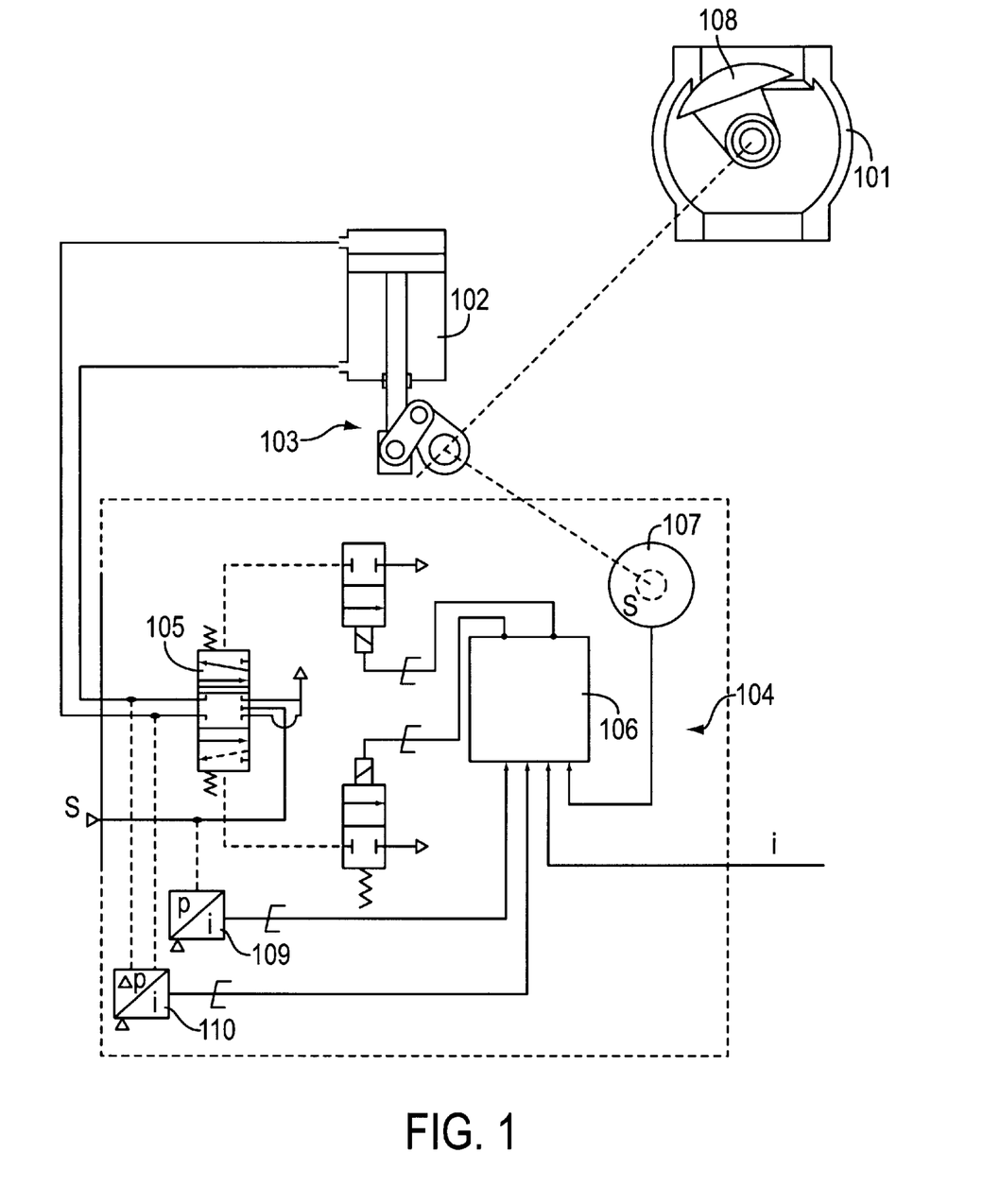
FIG. 1 illustrates schematically a control valve apparatus in accordance with the present invention.

FIG. 1 illustrates an apparatus comprising a control valve 101, an actuator 103 driven by a cylinder-piston device 102 and a positioner 104. The actuator is controlled by a pilot valve 105. Messages of the positioner are processed by a printed circuit card 106 where the control information is stored in. A sensor 107 measures the position s of a closing member 108, a sensor 109 measures the input pressure $p_s$ of the positioner and a sensor 110 measures the difference $\Delta p$ between the input and output pressure of the actuator. These sensors are located in the positioner. The flow of the different electric messages and measurements is marked on the diagram. Control signal i is input in the system.

Alert 1 indicates a circuit card problem of the positioner, as stated above, but it is not a part of the present invention.

Alert 2 indicates a slide problem of the control valve.

Figure 2:
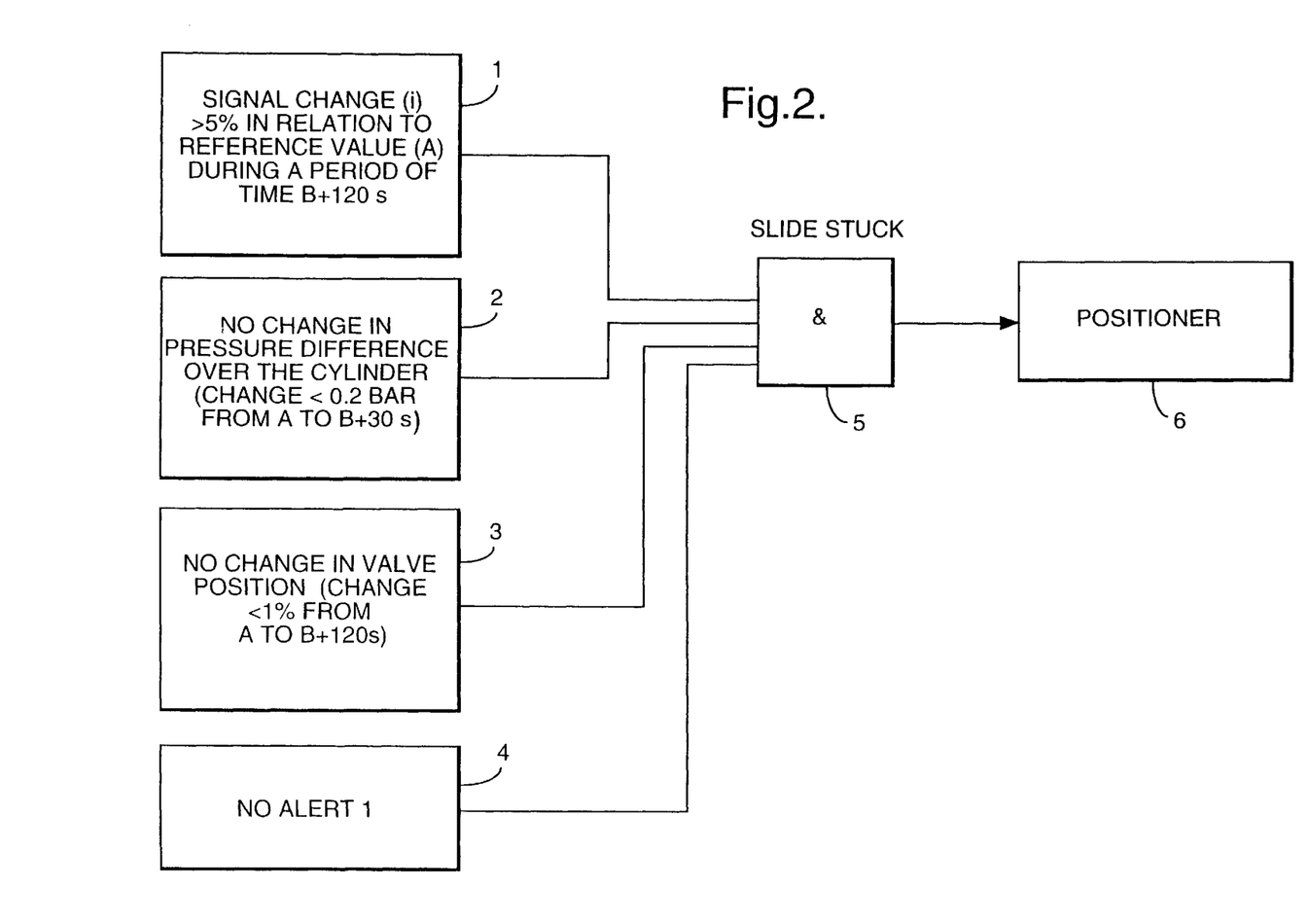
FIG. 2 illustrates conditions and conclusions of alert 2.
Figure 3:
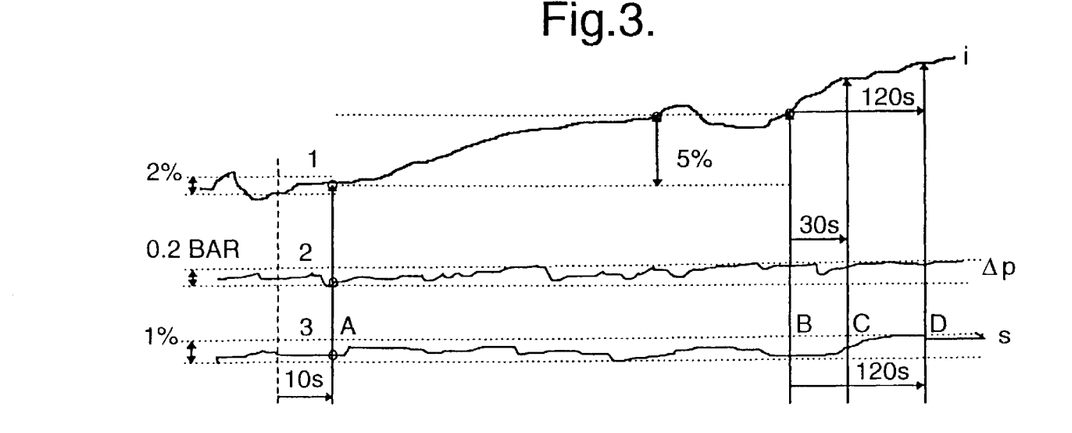
FIG. 3 illustrates as a function of time the quantities to be monitored for alert 2.

FIG. 2 illustrates as a diagram four different conditions by means of which the deduction concerning the alert 2 is performed. In FIG. 3, the operation for the alert 2 is described, that is, the quantities monitored as a function of time and their parameters. Point A is the point of the time axis, where the values of the control signal i, the difference $\Delta p$ between the input and output pressure of the actuator, and the valve position s to be monitored have for repeating reading cycles been within the given limit values for a required time. The values of the quantities of this balance state A named as "the initial situation", are stored in the registers. If a change of >5% occurs in the control signal, the time counter starts. If the signal change returns below the limit of 5% within a chosen period of time, the time counter is reset to zero and there will be no changes in the other registers if during the change of the control signal i no change of >1% has occurred in the valve positions in relation to the value of the initial situation A. In that case, a new initial situation A has to be set. If both the control signal i and the valve position s exceed the values of the balance conditions of the initial situation A, a new initial situation will be searched.

Condition 1: A change of more than 5% of the control signal i lasts more than 120 s, in other words, from point B to point D in FIG. 3.

Condition 2: A change of the difference $\Delta p$ between the input and output pressure of the actuator is within the predetermined limits, in FIG. 3 the change is <0,2 bar in the period of time A→B and from B to C.

Condition 3: A change of the valve position s is within the 25 predetermined limits, in FIG. 3 the change <1% in the period of time A→B and from B to C.

Condition 4: No ALERT 1.

Based on this data, conclusion 5 will be reached: the slide of the pilot valve is stuck, whereby the location of the fault 6 is in the positioner.

The range to be considered is from 10 to 90% of the movement range of the control valve, in other words, the most extreme starting and ending positions of the movement range are not considered.

In the example of FIG. 3, a change of $\leq 2\%$ of the control signal i and duration of 10 s; a change $\leq 0,2$ bar of the difference $\Delta p$ of the input and output pressure of the actuator, and duration of 10 s; and a change of $\leq 1\%$ of the position s of the control valve and duration of 10 s have been selected as parameters describing a balance state.

The corresponding parameters of the alert state are: a change of >5% of the control signal i and time of 120 s, in other words on the time axis from B to D; a change of $\leq 0,2$ % of the difference $\Delta p$ of the input and output pressure, and time of 30 s, in other words on the time axis from B to C; and a change of $\leq 1\%$ of the position s and time of 120 s, i.e. from B to D. Naturally also other parameter values can be selected according to need. From the alerts, the first and the last one will be stored as well as their times of occurence and the total number of the alerts. The reading cycle is 0,1 S.

Alert 3 means a large of difference between the control signal and the valve position.

Figure 4:
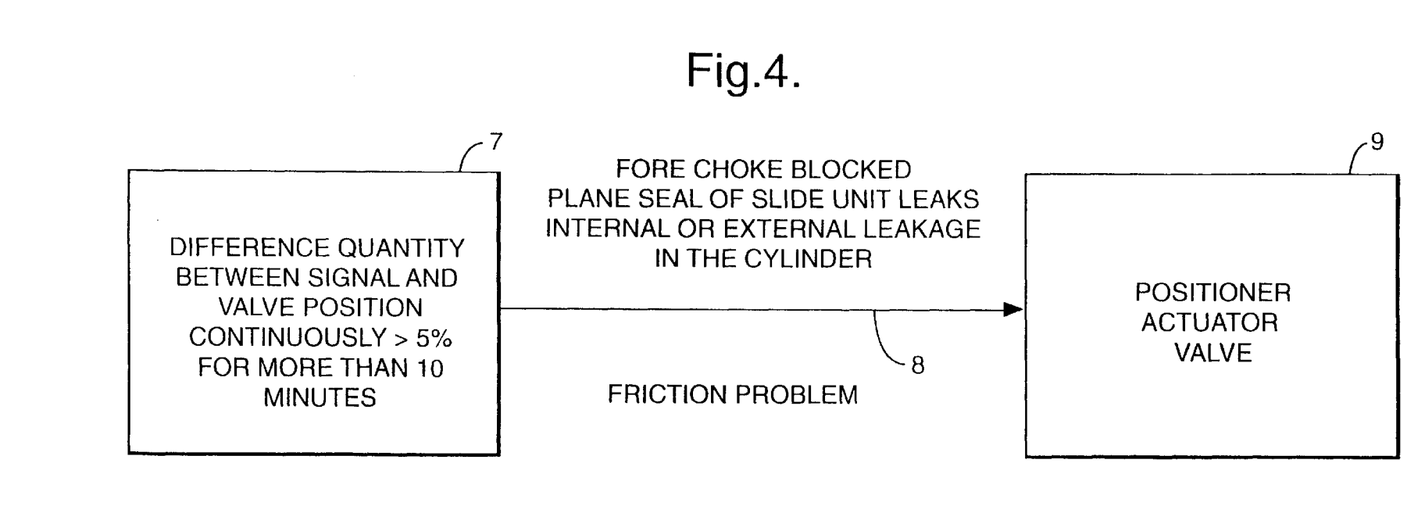
FIG. 4 illustrates conditions and conclusions of alert 3.

FIG. 4 illustrates the condition of the alert 3 and the conclusion.

Condition 7: The difference between the valve position corresponding to the signal and the measured valve position is >5% continuously for more than 10 minutes.

Conclusion 8 is that this means either, that the fore choke of the positioner for reducing the input pressure of the compressed air fed to the electropneumatic positioner, so that it is suitable for electric control, is blocked, or the plane seal of the slide unit of the pilot valve leaks, or there is an internal or external leakage in the cylinder of the actuator, or there is a friction problem in the actuator or valve.

The location 9 of the fault is in the positioner, actuator or valve.

The range to be considered is from 10 to 90% of the movement range of the valve.

Parameters are selected to be the same as the above mentioned values of the condition 7, that is, the quantity of difference of >5% and duration of 10 minutes. From the alerts the first and the last one, their times of occurence and the total number of the alerts are stored. The reading cycle is 0,1 s.

Alert 4 means a friction problem.

Figure 5:
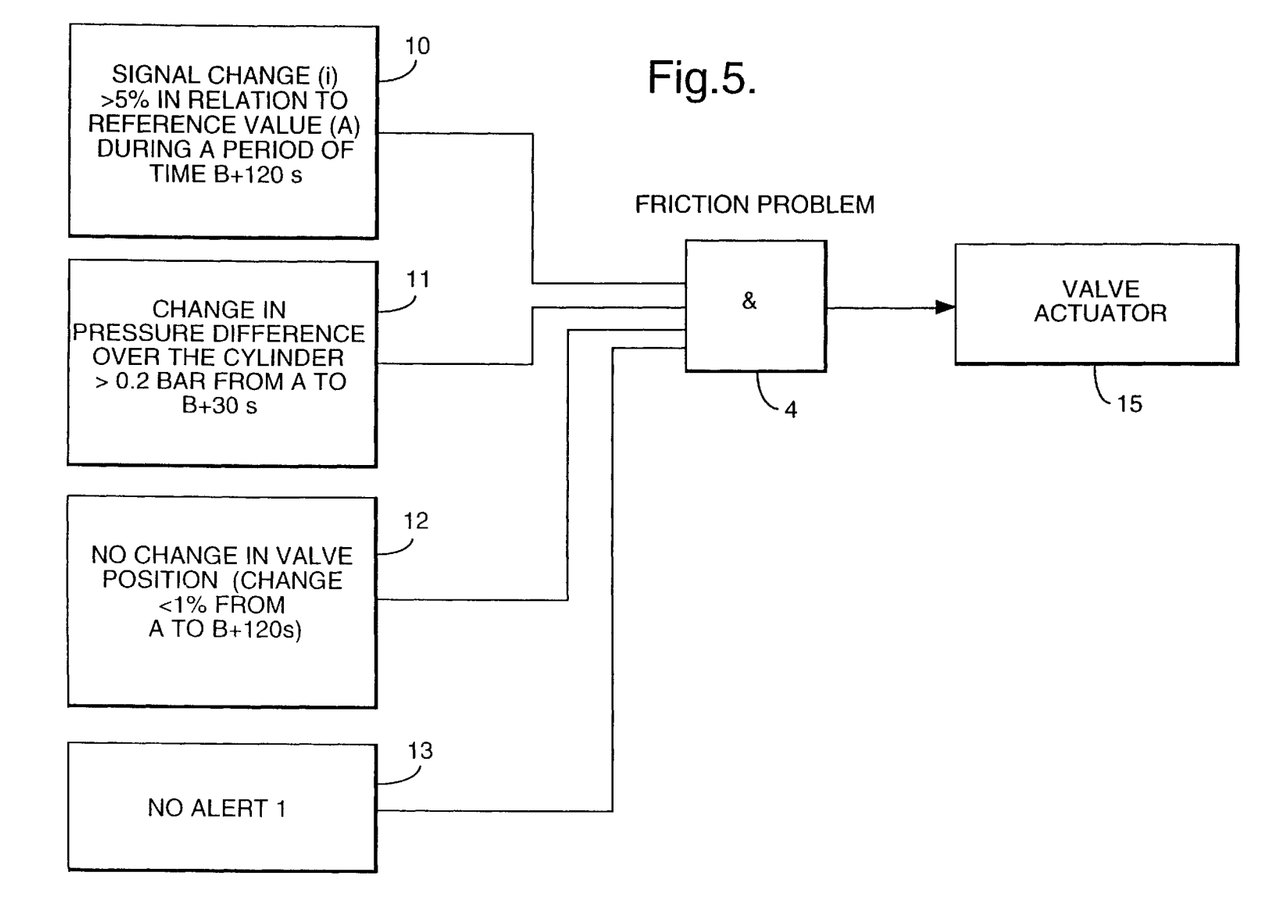
FIG. 5 illustrates conditions and conclusions of alert 4.

FIG. 5 illustrates the four conditions of the alert 4 and the conclusions.

Condition 10: a change of more than 5% of the control signal 1 lasts for more than 120 s, in FIG. 3 from point B to point D.

Condition 11: a change of the difference $\Delta p$ of the input and output pressure of the actuator is more than 0,2 bar for 30 s, in FIG. 3 from point B to point C.

Condition 12: a change of the valve position s is within the selected limits, in FIG. 3 the change is <1% in the period of time from A to B and from B to D.

Condition 13: No ALERT 1.

When these conditions are fulfilled, the conclusion 14 is that there is a friction problem, the location 15 of which is either in the valve or in the actuator.

The range to be considered is from 10 to 90% of the movement range of the valve.

The initial situation A and its quantities to be stored are the same as in Alert 2 (FIG. 3). The operation is the same as in Alert 2, except that in this case the difference between the input and output pressure has to change, whereas in Alert 2, this difference had to be unchanged.

As parameters of the alert state, the above mentioned values of the conditions from 10 to 12 have been selected, in other words, a change of >5% of the control signal i and time of 120 s; a change of >0,2 bar of the difference $\Delta p$ between the input and output pressure of the actuator and time of 30 s; and a change of $\leq 1\%$ of the position s of the regulating valve and time 120 s.

From the alerts the first and the last one will be stored, their times of occurence and the total number of the alerts. The reading cycle is 0,1 s.

Alert 5 will be received by following the trend curve of the load factor.

Figure 6:
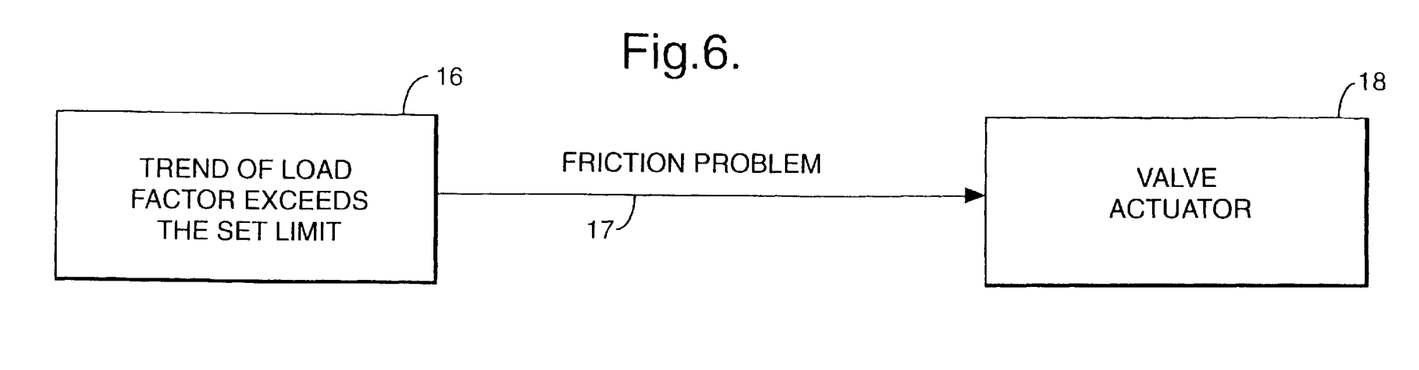
FIG. 6 illustrates conditions and conclusions of alert 5.

FIG. 6 illustrates condition 16 of the alert 5: the trend of the load factor exceeds a set limit. Conclusion 17 is that there is a friction problem, the location 18 of which is either in the valve or in the actuator.

The range to be considered is from 10 to 90% of the movement range of the valve.

Figure 7:
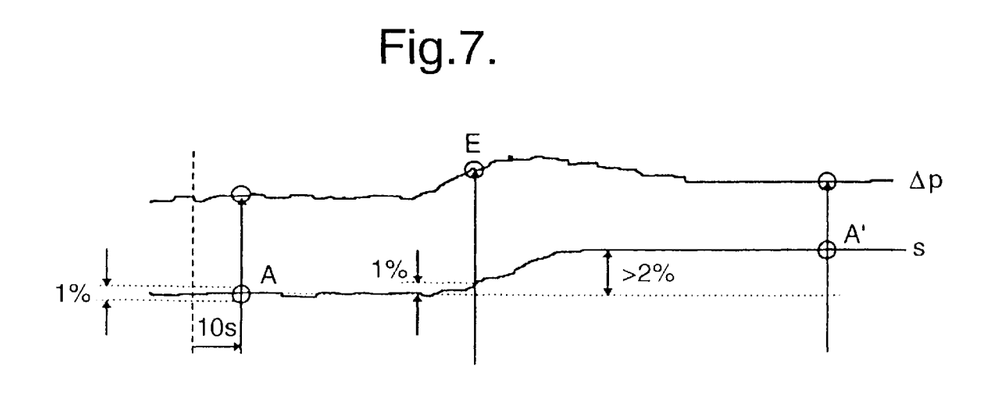
FIG. 7 illustrates quantities to be monitored for alert 5 and FIG. 8 illustrates a trend curve of the load factor.

FIG. 7 illustrates the operation for alert 5, in other words, as function of time the changes of the difference $\Delta p$ between the input and output pressure of the actuator and the valve position s. The initial situation A and its quantities to be stored are determined as in. Alert 2. After that the change of the valve position s will be observed. When the change s exceeds by 1% the value of the initial situation stored into the memory, this situation is determined as the starting point E of the valve, whereby the difference $\Delta p$ between the input and output pressure of the actuator and the input pressure $p_s$ of the positioner will be stored. Load factor k will be calculated from these values. The next balance state A' will be selected as a new initial situation. If the difference between the valve positions in the initial situation A and in the new initial situation A' is bigger than 2%, the calculated load factor k will be stored in order to edit the trend curve.

An alert will be given when five consecutive measurements exceed a set limit.

Load factor k of the actuator will be obtained from the following formula:

$$k = \frac{\Delta p_L}{p_s} \cdot 100\%$$

where
$\Delta P_L$=the difference between the input and output pressure of the actuator at the starting point of the valve
$P_s$=the input pressure of the positioner Parameters of alert 5 are a change of >1% of the position s compared with the stored value of the initial situation A, load factor k, a change of >2% of the position s compared with the stored value of the initial situation A, an alert limit of the load factor trend and the number of exceedings having lead to an alert. Reading cycle is 0,1 s.

Figure 8:
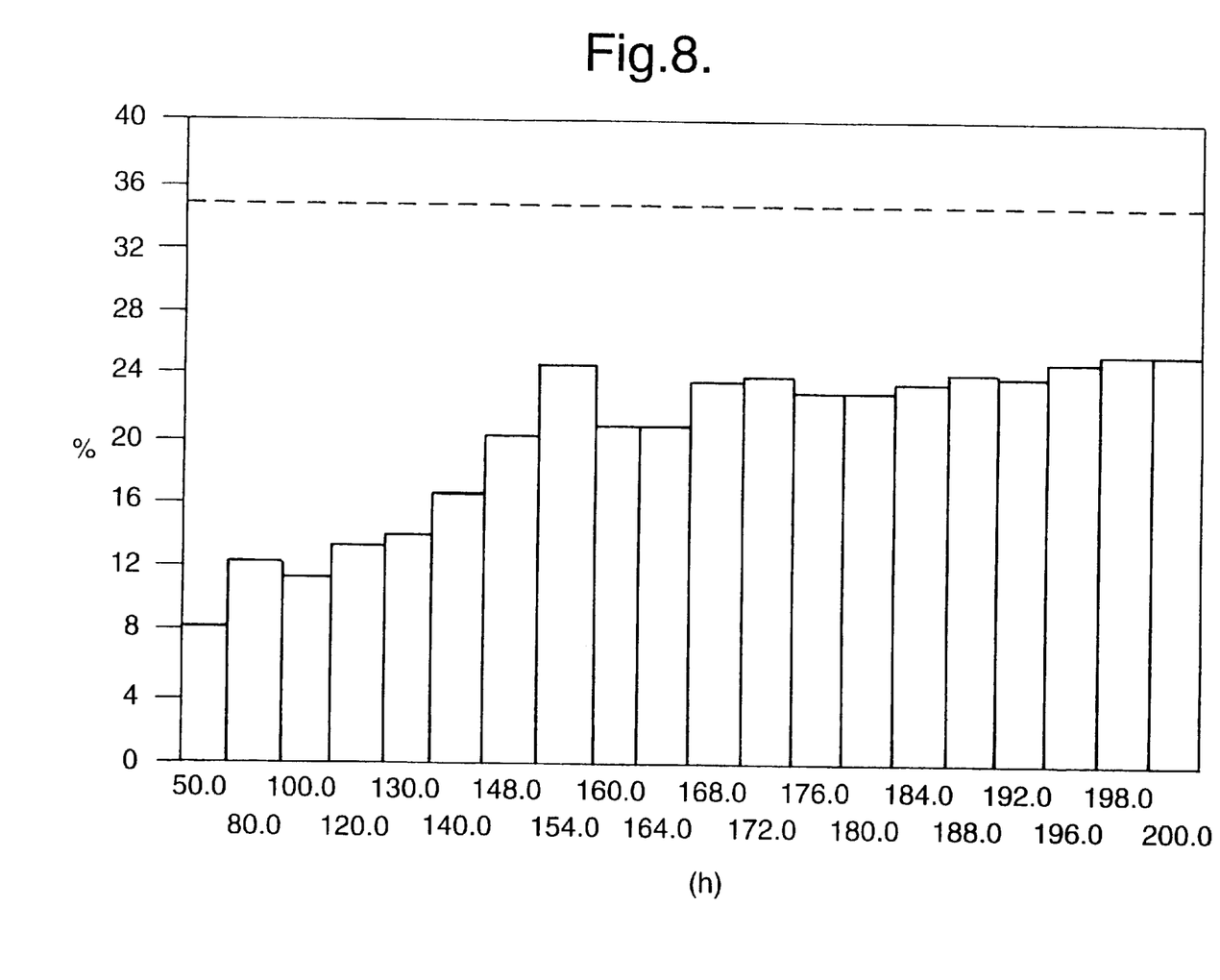

FIG. 8 illustrates a trend curve calculated from the average values of several load factors as a function of time and the set alert limit.

What is claimed is:

1. A method for surveying the condition of a control valve apparatus, the control valve comprising:
   a closing element;
   an actuator which adjusts a position of the closing element;
   an electropneumatic positioner including a pilot valve and which controls the actuator;
   sensors which monitor operation of the valve during operation by reading at reading intervals a control signal, a difference between an input and an output pressure of the actuator and a position of the valve; and
   a microprocessor accepting input from the sensors and programmed with deduction rules, the microprocessor calculating from the input and the deduction rules a location of a fault,
   the method comprising:
   monitoring the control valve in a balance state, the balance state comprising a state wherein changes of the valve position, the control signal, and the difference between the input and output pressure of the actuator are continuously smaller than predetermined values for at least a predetermined period of time;
   storing readings from the sensors of the position, the control signal, and the difference between the input and output pressure of the actuator in the balance state as initial readings;
   monitoring the control valve during its operation to determine operational readings of the valve position, the control signal and the difference between the input and output pressure of the actuator;
   comparing the operational readings of the valve position, the control signal and the difference between the input and output pressure of the actuator to the initial readings of the position, the control signal and the difference between the input and output pressure of the actuator;
   producing a fault message indicating that a fault is located in the pilot valve of the positioner when:
      a deviation between the operational reading and the initial reading of the control signal exceeds a first limit value for a first time period,
      a deviation between the operational reading and the initial reading of the valve position is smaller than a second limit value during the first time period,
      no fault message is produced by diagnostic circuits on the positioner, and
      the operational reading is less than the initial reading of the difference between the input and output pressure of the actuator for at least a portion of the first time period;
   producing a fault message indicating that a fault is located in the valve or in the actuator when:
      the deviation between the operational reading and the initial reading of the control signal exceeds a first limit value for a first time period,
      the deviation between the operational reading and the initial reading of the valve position is smaller than a second limit value during the first time period,
      no fault message is produced by diagnostic circuits on the positioner, and
      the operational reading is greater than the initial reading of the difference between the input and output pressure of the actuator for at least a portion of the first time period.

2. A method according to claim 1, further comprising:
   storing a first and a last of several consecutive fault messages;
   storing respective times of occurrence of the first and last fault messages; and
   storing a number of each of the consecutive fault messages.

3. A method according to claim 1, further comprising:
   monitoring an input pressure of the positioner during operation of the valve in a balance state; and
   producing a fault message indicating a fault in the actuator or in friction in the valve when:
      a loading factor exceeds a predetermined limit and a difference between the initial reading of the valve position, and
      a next balance state reading of the valve position differs from the initial valve position by a predetermined value,
   wherein the loading factor is calculated as a ratio between the difference of the input and output pressure of the actuator and the input pressure of the positioner.

4. A method according to claim 2, further comprising:
   monitoring an input pressure of the positioner during operation of the valve in a balance state; and
   producing a fault message indicating a fault in the actuator or in friction in the valve when a loading factor exceeds a predetermined limit and a difference between the initial reading of the valve position and a next balance state reading of the valve position exceeds a predetermined value,
   wherein the loading factor is calculated as a ratio between the difference of the input and output pressure of the actuator and the input pressure of the positioner.

* * * * *